United States Patent [19]
Hasegawa et al.

[11] Patent Number: 5,218,679
[45] Date of Patent: Jun. 8, 1993

[54] PROGRAMMABLE CONTROLLER WITH INPUT/OUTPUT SIGNAL CONVERTING CIRCUIT FOR VARIABLY SETTING A NUMBER OF INPUTS AND/OR OUTPUTS

[75] Inventors: Jun Hasegawa; Yutaka Aoyama; Yasushi Ishii, all of Kanagawa, Japan

[73] Assignee: Fuji Electric Co., Ltd., Kanagawa, Japan

[21] Appl. No.: 662,172

[22] Filed: Feb. 28, 1991

[30] Foreign Application Priority Data

Mar. 1, 1990 [JP] Japan .................................. 2-47165
Jan. 16, 1991 [JP] Japan .................................. 3-3224

[51] Int. Cl.⁵ .............................................. G06F 13/00
[52] U.S. Cl. ...................................... 395/275; 385/31
[58] Field of Search ................... 364/DIG. 1, DIG. 2; 395/275, 325; 385/14, 15, 31; 357/19

[56] References Cited

U.S. PATENT DOCUMENTS 3,549,783 12/1970 Bendrick et al. .
4,771,403 9/1988 Maskovyak et al. ............... 395/275

FOREIGN PATENT DOCUMENTS 935465 8/1963 European Pat. Off. .
0191865 8/1986 European Pat. Off. .
2159982A 12/1985 United Kingdom .
2223884A 4/1990 United Kingdom .

OTHER PUBLICATIONS

Newark Industrial Electronic Catalog No. 70–1970.

*Primary Examiner*—Robert L. Richardson
*Attorney, Agent, or Firm*—Finnegan, Henderson, Farabow, Garrett & Dunner

[57] ABSTRACT

A programmable controller with an I/O signal converting circuit having an input element and an output element, comprises a signal I/O unit having a plurality of element sockets capable of replaceably accommodating both the input element and the output element; a selecting unit for selecting the type of the accommodated element; and a signal storing and sending unit. Each element socket may accommodate the input and output elements. Therefore, the space required to install the I/O circuits is reduced, and the number of input and output elements can be arbitrarily set.

13 Claims, 7 Drawing Sheets

PROGRAMMABLE CONTROLLER WITH INPUT/OUTPUT SIGNAL CONVERTING CIRCUIT FOR VARIABLY SETTING A NUMBER OF INPUTS AND/OR OUTPUTS

BACKGROUND OF THE INVENTION

1. Field of the Invention

The invention relates to programmable controllers for automatically controlling electronic devices, and more particularly to a programmable controller capable of variably setting a number of input/output signals for the electronic devices.

2. Discussion of the Related Art

A block-type programmable controller, which is typical of conventional programmable controllers, has all of its electric circuits contained within a housing. This includes the input/output (I/O) elements required by the controller to convert received information signals into a form suitable for information storage and processing. If a particular I/O element experiences problems or fails completely, replacement of the I/O element is difficult given the enclosed structure of the circuits. Replacement usually involves replacing the whole unit or swapping a card within the unit even if only a single I/O element is defective. Furthermore, the manufacturer is generally the only party able to replace I/O elements.

Figure 19:
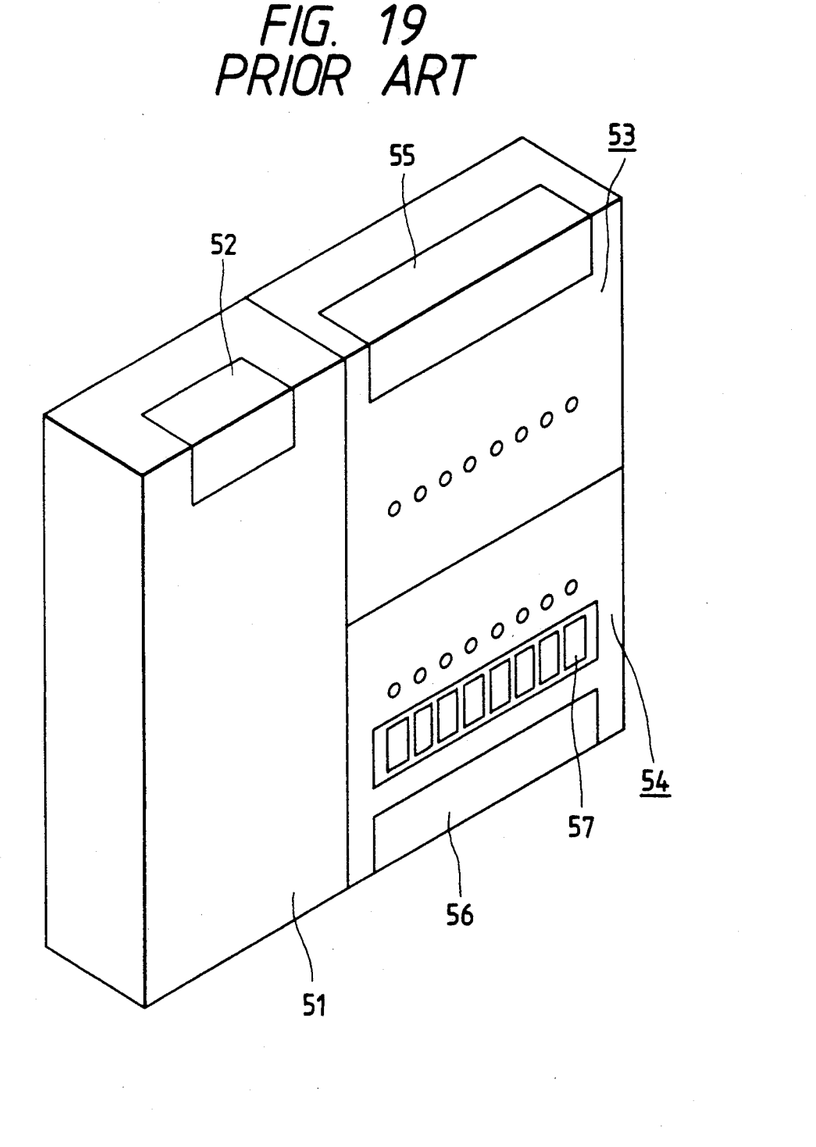
FIG. 19 is a perspective view showing the appearance of a conventional programmable controllers.

To overcome such shortcomings, a block-type programmable controller, as shown in FIG. 19, with a replaceable output element is known in the art. In FIG. 19, reference numerals 51, 52 designate a control unit and a power unit contained in a case; 53, an input unit for receiving information signals from an electronic device under control; 54, an output unit for sending information signals to the controlled electronic device; and 57, a replaceable output element for level converting output data signals. The output element 57 is replaceable via a connecting socket (not shown).

However, only the output element 57 is typically replaceable in the conventional programmable controller shown in FIG. 19. Any defective elements in the input unit must still be corrected by replacing the whole input unit 53 or swapping a card within the input unit.

SUMMARY OF THE INVENTION

The present invention has been made in view of the above circumstances. Accordingly, an object of the invention is to provide a programmable controller which allows replacement of an input element in addition to replacement of an output element. A further object of the present invention is to provide these replacement capabilities in a configuration which provides a programmable controller of minimum size.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purposes of the invention, as embodied and broadly described herein, the invention comprises an I/O signal converting circuit including an input element for converting an information signal received from a controlled device from a transmission signal form to a control signal form, an output element for converting an information signal sent to the controlled device from the control signal form to the transmission signal form, and an element socket to which both the input element and the output element can be replaceably attached. The input element and the output element are substantially similar in external shape and identical in pin layout.

The invention is also directed to a programmable controller comprising a signal input/output section having a plurality of element sockets to which both an input element and an output element can be replaceably attached, the input element converting an information signal received from a controlled device from a transmission signal form to a control signal form and the output element converting an information signal sent to the controlled device from the control signal form to the transmission signal form, and the input element and the output element being substantially similar in external shape and identical in pin layout, a section for selecting an element attached to each one of the plurality of element sockets, and a signal storage section for storing information signals in the control signal form received from an element socket to which the input element is attached and for sending stored information signals in control signal form to an element socket to which the output element is attached in accordance with a selection by the instruction means.

The invention allows the input element and the output element to be replaceably attached to the element sockets. Therefore, the programmable controller need not be constructed with separate input and output circuits, thereby reducing the space required for installing the I/O circuits as compared with a conventional controller. In addition, data regarding the type of element attached to each element socket is maintained in the storage means. Therefore, it is no longer necessary to change the element socket connections every time the input element and the output element are replaced. Finally, the I/O elements provide a buffering and signal converting capability between the programmable controller and the controlled device.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

DETAILED DESCRIPTION OF THE PREFERRED EMBODIMENTS

Embodiments of the present invention will now be described with reference to the accompanying drawings.

Figure 1:
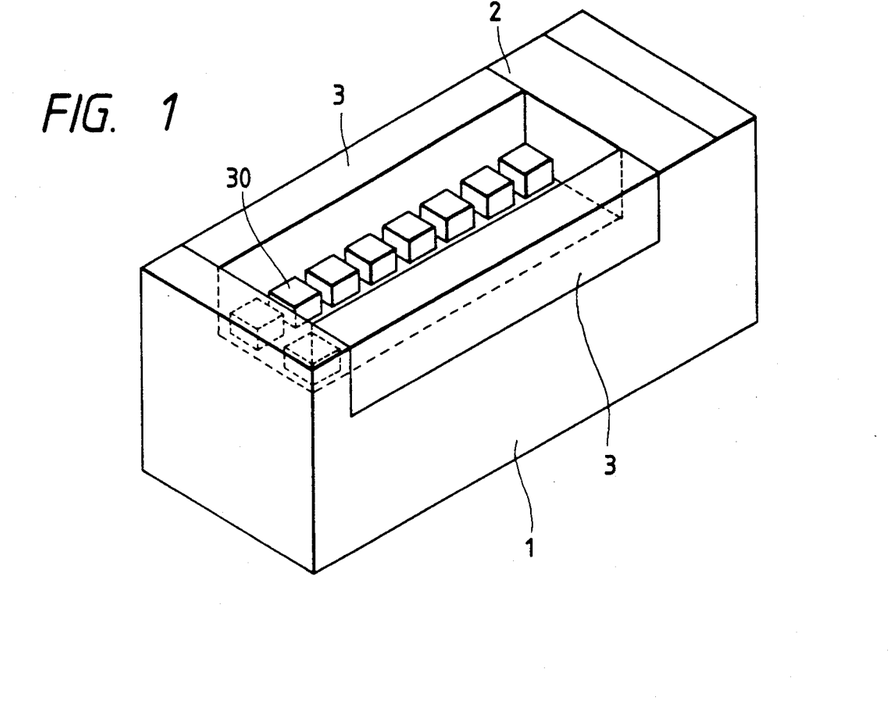
FIG. 1 is a perspective view showing the appearance of a programmable controller according to the invention.

The appearance of the main body of a programmable controller, which is an embodiment of the present invention, will be described with reference to FIG. 1. In FIG. 1, reference numeral 1 designates the main body of the programmable controller, which includes a built-in control unit 2 for receiving/sending information signals and performing sequential operations; and reference numeral 3 designates an input/output (I/O) terminal board. A wiring board (not shown) is provided adjacent to the terminal board 3 and I/O element sockets 30 are mounted on the wiring board.

Figures 2, 3:
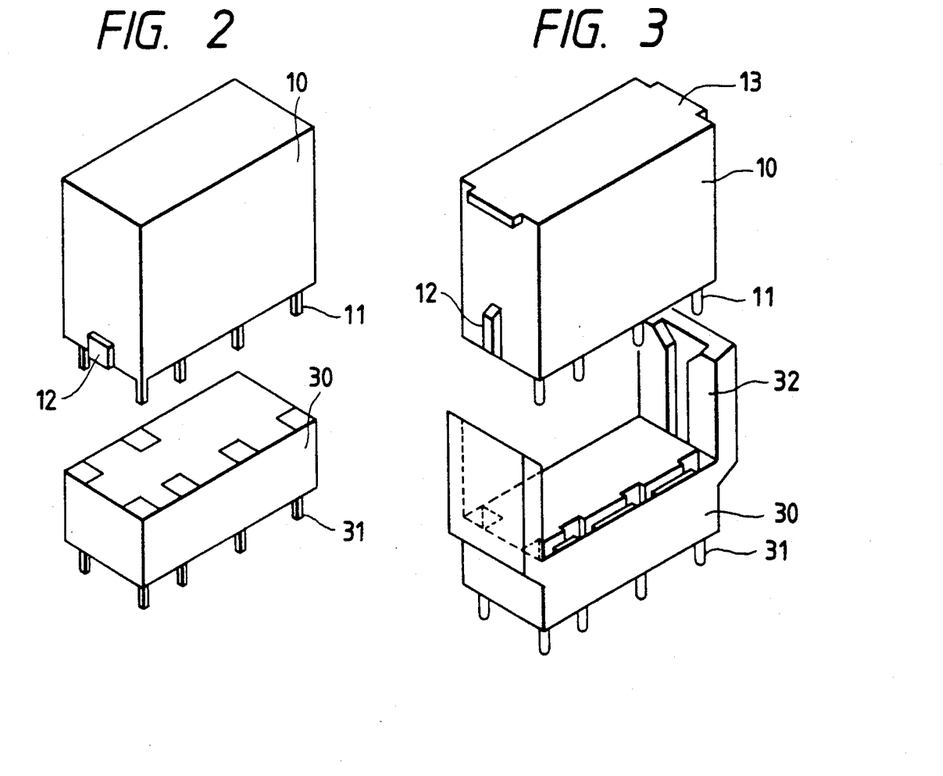
FIG. 2 is a perspective view showing the appearance of an input element and an element socket according to the invention.
FIG. 3 is a perspective view showing the appearance of another input element and another element socket according to the invention.

The shape of the input element will be described with reference to FIG. 2. In FIG. 2, reference numeral 11 designates a connection pin; 30, the element socket; and 31, a contact pin which is electrically and mechanically engageable with the connection pin 11. An engaging projection 12, which is engageable with an attaching-/removing fitting at the time the element is attached or removed, is disposed on one side of the element. As a result of the configuration of the main body and the socket, the input element can be replaced on a single unit basis.

Another shape of the input element 10 and its element socket 30 will be described with reference to FIG. 3. The input element is designed to be identical with the output element in external shape and pin layout.

Figure 4:
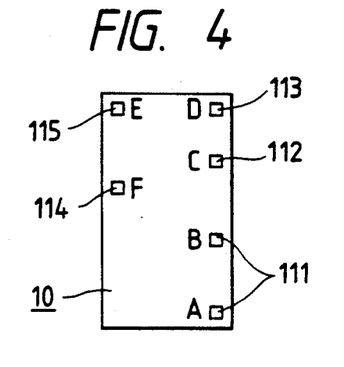
FIG. 4 is a plan view showing a pin layout of an input element.

FIG. 4 shows an exemplary pin layout of the input element 10 of the embodiment of the invention. In FIG. 4, reference numeral 111 designates input terminal pins to be connected to input terminals; 112, an input control signal pin to be connected to the control unit 2 of the programmable controller; and 113, a power pin for driving the input element 10.

Figure 5:
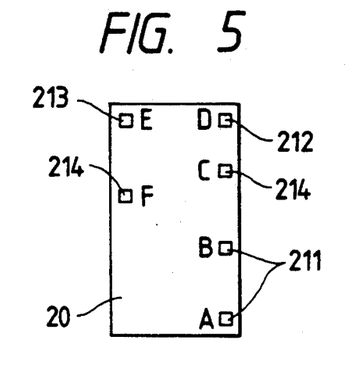
FIG. 5 is a plan view showing a pin layout of an output element.

FIG. 5 shows an exemplary pin layout of the output element 20 of the embodiment of the invention. In FIG. 5, reference numeral 211 designates output terminal pins to be connected to output terminals; 212, a power pin for driving the output element; and 213, an output control signal pin to be connected to the control unit 2 of the programmable controller.

Accordingly, both the input element 10 and the output element 20 have the identical pin layout so that they can be attached to a single element socket 30.

FIGS. 6 to 10 show exemplary circuit configurations of the input element and the output element which can be used in the embodiment of the invention.

Figure 6:
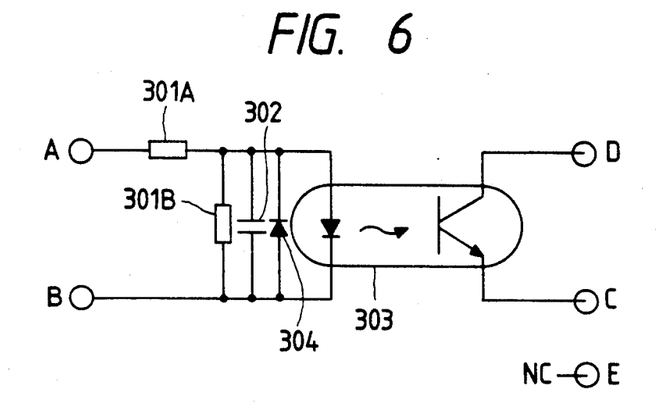
FIG. 6 is a diagram showing an exemplary circuit configuration of an input element applicable to the programmable controller according to the invention.

FIG. 6 shows an example in which on/off information signals (DC) are received and converted to control signal levels, which can be processed by a central processing unit (CPU). The input element shown in FIG. 6 has a resistor 301A and the light-emitting diode (LED) of a photocoupler 303 connected in series across input terminals A and B, which correspond to pins 111 in FIG. 4. Resistor 301B, capacitor 302, and diode 304 are connected in parallel with the LED of photocoupler 303. A phototransistor of the photocoupler 303 is connected to terminal D which corresponds to the 5V-power pin 113 of FIG. 4 and to terminal C which corresponds to the input control signal pin 112 of FIG. 4.

Figure 7:
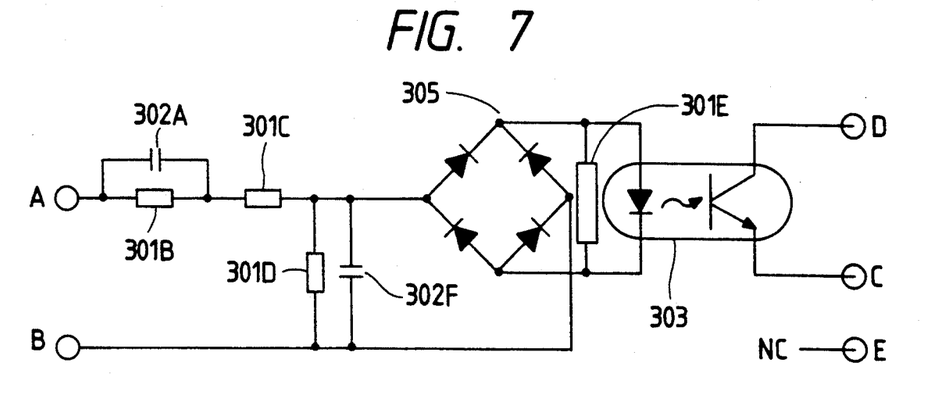
FIG. 7 is a diagram showing another exemplary circuit configuration of the input element applicable to the programmable controller according to the invention.

FIG. 7 shows an example in which information signals are received in AC form. The input element of FIG. 7 has the AC input terminals of a diode bridge rectifier 305 connected to the input terminals A and B, which correspond to pins 111 in FIG. 4. An LED of the photocoupler 303 is connected to the DC output terminal of the diode bridge rectifier 305. Reference numerals 301B to 301E designate resistors; and 302A and 302F designate capacitors.

Figure 8:
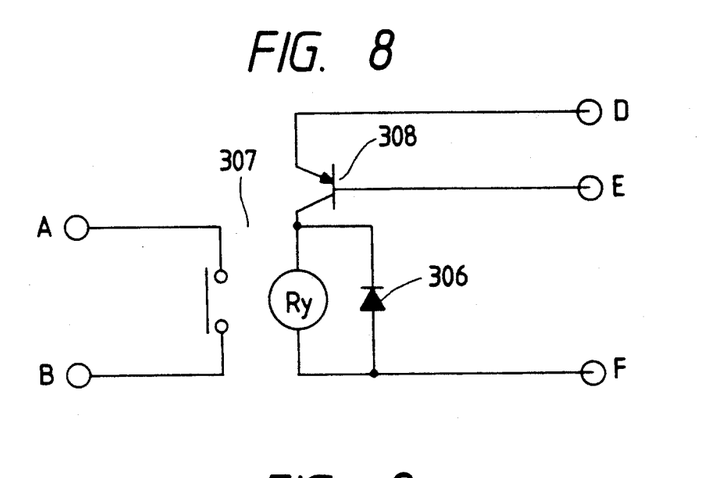
FIG. 8 is a diagram showing an exemplary circuit configuration of an output element applicable to the programmable controller according to the invention.

FIG. 8 shows an example in which a control signal level information signal is level converted by a mechanical relay. This output element has a relay contact 307 connected to terminals A and B which correspond to output terminal pins 211 in FIG. 5. The emitter of a switching transistor 308 is connected to relay (Ry) in series with terminal D, which is connected to the 5V-power pin 212 of FIG. 5. The base of the switching transistor 308 is connected to terminal E which corresponds to output control signal pin 213 of FIG. 5. The collector is connected to terminal F, which corresponds to 0V-power pin 214 in FIG. 5, through the relay Ry. Reference numeral 306 designates a diode connected parallel to the relay Ry.

Figure 9:
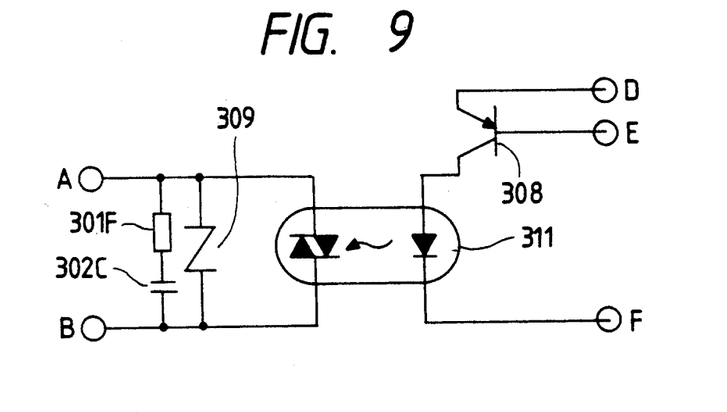
FIG. 9 is a diagram showing another exemplary circuit configuration of the output element applicable to the programmable controller according to the invention.

FIG. 9 shows an example in which the output relay is a solid-state relay. In this output element, a phototriac of a solid-state relay 311 is connected to the output terminal pins 211 of FIG. 5 (terminal symbols A, B). A series-circuit consisting of a resistor 301F and a capacitor 302C, and a surge absorber 309 are connected to the phototriac in parallel. The emitter-collector path of the switching transistor 308 is connected to the LED of the solid-state relay 311 in series.

Figure 10:
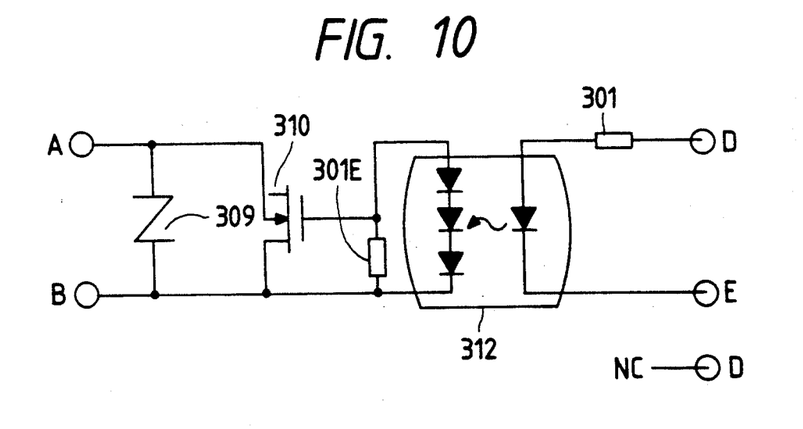
FIG. 10 is a diagram showing still another exemplary circuit configuration of the output element applicable to the programmable controller according to the invention.

FIG. 10 shows an example in which the output relay is made of a transistor. In this output element, the source-drain path of a gate transistor 310 is connected to the output terminal pins 211 of FIG. 5 (terminal symbols A, B). Light-receiving elements of photovoltaic coupler 312 and a contact of the resistor 301E are connected to the gate of the gate transistor 310. A light-emitting element of the photovoltaic coupler 312 is connected to the 5V-power pin 212 (terminal symbol D) and the output control signal pin 213 (terminal symbol E) of FIG. 5.

Figure 11:
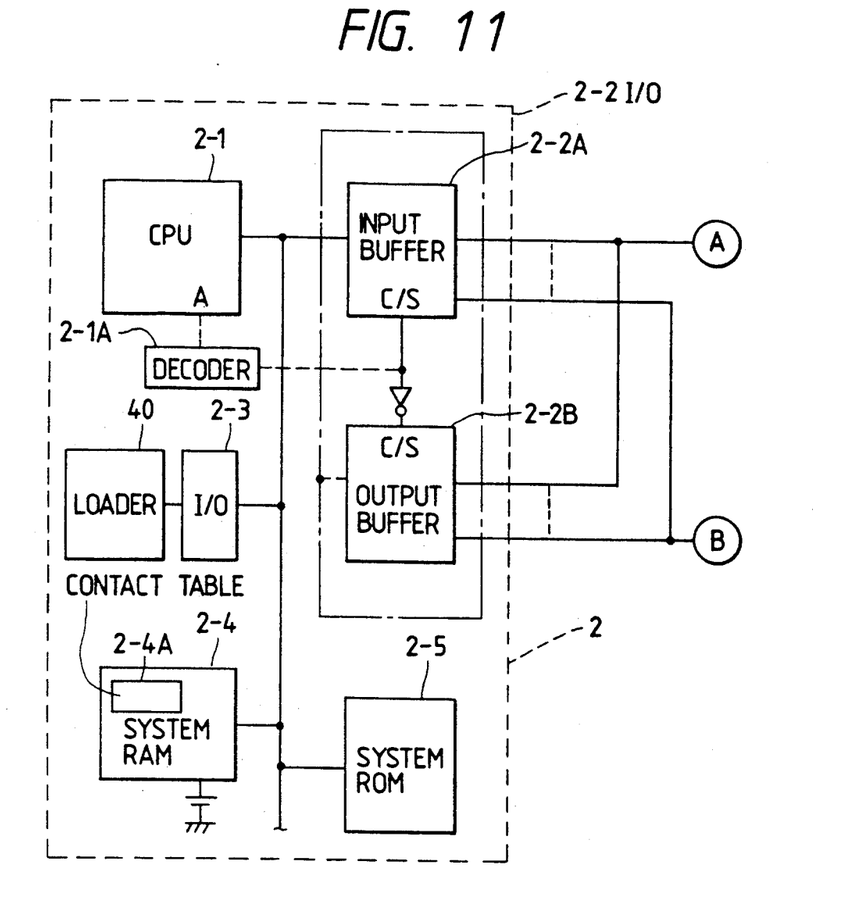
FIG. 11 is a block diagram showing a circuit configuration of the programmable controller according to the invention.
Figure 12:
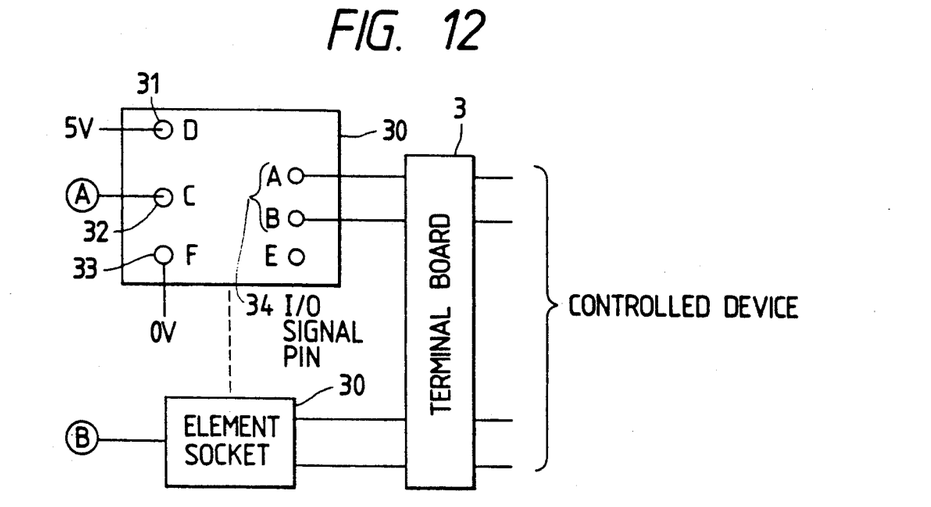
FIG. 12 is a block diagram showing a circuit configuration of the programmable controller according to the invention.

FIGS. 11 and 12 show exemplary circuit configurations of a programmable controller using the above-described I/O elements.

In FIGS. 11 and 12, the control unit 2 of the programmable controller includes the following components. A CPU 2-1 controls circuit operations and stores information signals received from a controlled device in a memory (not shown). The CPU 2-1 reads the information signals stored in the memory after these information signals have been sequentially processed and transmits the information signals to the controlled device. An I/O interface (I/O) 2-2 serves as an information signal storing means and consists of input buffer 2-2A and an output buffer 2-2B for temporarily storing the information signals received from and transmitted to the controlled device.

Each of the I/O buffers 2-2A, 2-2B consists of a plurality of registers and can temporarily store input information signals and output these temporarily stored information signals upon instruction given from the CPU 2-1 through a decoder 2-1A. In this embodiment, a single input register and a single output register are connected to a single element socket. A pair of I/O registers are assigned a common address (one bit), and either register, input or output, is selected by addressing a selection bit.

A loader 40 prepares a sequence program, which defines a control operation for the controlled device and inputs the prepared sequence program through loader I/O 2-3. The loader 40 also serves as a selection means to select the type of the register at I/O 2-2, i.e., whether it is an input register or an output register.

A system RAM (random access memory) 2-4 temporarily stores data to be used in CPU 2-1 operation and includes a table which stores the selection information received from the loader 40. This selection information includes the address and selection bit of the selected register in I/O 2-2.

A system ROM (read only memory) 2-5 stores a control program to be executed by the CPU 2-1. The CPU 2-1 performs various control operations by executing this control program.

Each element socket 30 as shown, for example, in FIGS. 4 and 5 has its input or output control signal terminal C connected to I/O 2-2 and has its input or output terminals A, B for transmission-signal-level information signals connected to the terminal board 3 of FIG. 1. The element socket 30 receives the respective input or output element. Accordingly, both the element socket 30 and the terminal board 3 function as signal I/O means.

The operation of receiving/sending information signals in the above circuit configurations will now be described. There are 16 element sockets shown in the embodiment illustrated in FIG. 1. Accordingly, each input buffer 2-2A and output buffer 2-2B has 16 registers. In addition, addresses "0" to "15" (in decimal) are assigned to the respective registers. A selection bit of "0" is assigned to an input register and a selection bit of "1" to an output register.

Ten (10) on/off information signals are received from the controlled device and six (6) on/off information signals are sent thereto. Thus, the respective element sockets 30 to which registers having the addresses "0" to "9" are connected have an input element, while the respective element sockets 30 to which registers having addresses "10" to "15" are connected have output elements.

The loader 40 selects input registers for the elements having addresses "0" to "9" and output registers for elements having addresses "10" to "15." This selection information is stored in the table 2-4A of system RAM 2-4 by the CPU 2-1.

Upon activation of the system under this condition, an information signal received from the controlled device is converted to a control-signal level by an input element and then temporarily stored in a register of the input buffer 2-2A. The CPU 2-1 references the table 2-4A, sequentially generates an address signal for the addresses "0" to "9" and then reads the information signal stored in the register. The read information signal is then transferred to the memory. Successively, the CPU 2-1 reads this transferred information signal from the memory, subjects it to a sequence operation, and writes an information signal for transmission to the memory as an operation result. Then, the CPU 2-1 reads the information signal for transmission from the memory and writes this information signal for transmission to an output register selected by the contact table 2-4A. After having written the information signal for transmission to the output register, the CPU 2-1 repeats the above-described input, sequence operation, and output processes for subsequent information signals.

The information signal written to the output buffer 2-2B is converted to a transmission-signal level by the respective output element in an element socket 30 and transmitted to the controlled device via the terminal board 3 (FIG. 12).

Figure 13:
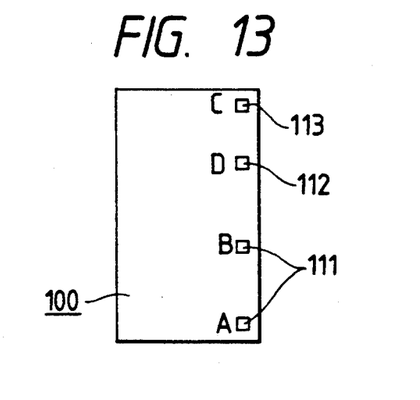
FIG. 13 is a plan view showing a pin layout of another input element according to the invention.

FIG. 13 shows an exemplary pin layout of an input element 100, which is another embodiment of the present invention. This particular embodiment has 4 pins. Reference numeral 111 designates input terminal pins to be connected to input terminals; 112, an input control signal pin to be connected to the control unit 2 of the programmable controller; and 113, a power pin for driving the input element. The circuit configuration of the input element 100 in this embodiment is identical with those shown in FIGS. 6 and 7 except that it does not have the pin designated by terminal symbol E.

Figure 14:
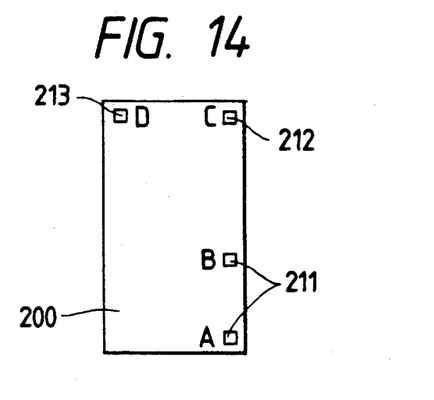
FIG. 14 is a plan view showing a pin layout of another output element according to the invention.

FIG. 14 shows an exemplary pin layout of an output element 200 having 4 pins. Reference numeral 211 designates output terminal pins to be connected to output terminals; 212, a power pin for driving the output element; and 213, an output control signal pin to be connected to the control unit 2 of the programmable controller.

Since the I/O elements are identical in pin layout of their terminal symbols A, B, D in this embodiment, either of the I/O elements can be attached to a single element socket 30.

Figure 15:
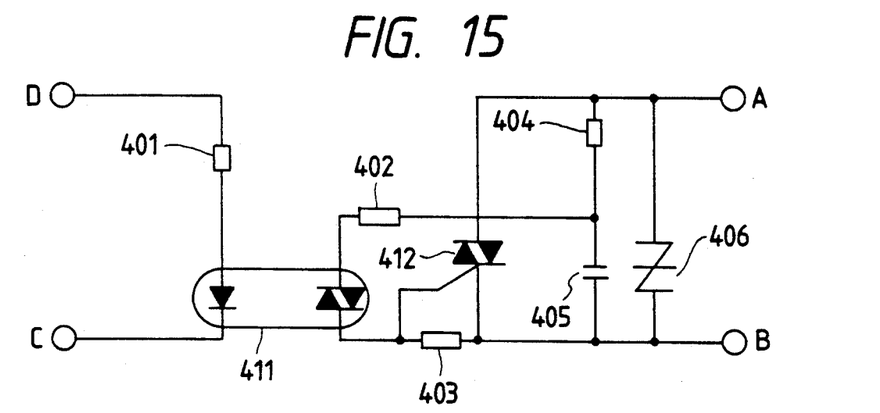
FIG. 15 is a diagram showing an exemplary circuit configuration of an output element which can be used in the programmable controller according to the invention.

FIG. 15 shows an example in which the output element 200 of FIG. 14 is made up of a solid-state relay. In this output element, an LED of a photocoupler 411 is connected to the 5V-power pin 212 (terminal symbol D) and the output control signal pin 213 (terminal symbol C) through a resistor 401. The phototriac of photocoupler 411 is connected to a contact of resistor 404 and capacitor 405 through resistor 402 and to gate resistor 403 of triac 412. The main current path of triac 412 is connected to output terminal pins 211 (terminal symbols A, B). Reference numeral 406 designates a surge absorber.

Figure 16:
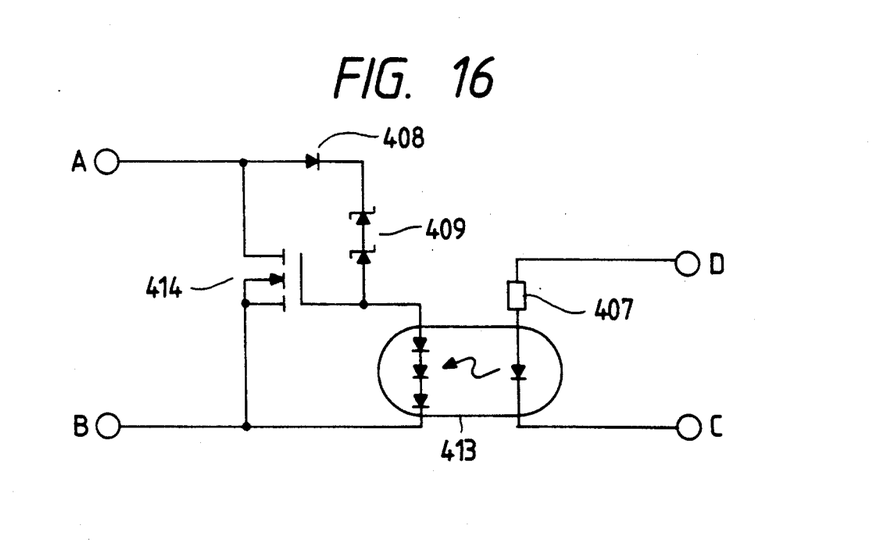
FIG. 16 is a diagram showing another exemplary circuit configuration of the output element which can be used the programmable controller according to the invention.

FIG. 16 shows another example in which the output element 200 of FIG. 14 is made up of a transistor. In this output element, an LED of a photovoltaic coupler 413 is connected to the 5V-power pin 212 (terminal symbol D) and the output control signal pin 213 (terminal symbol C). The LED of the photovoltaic coupler 413 is connected to gate transistor 414. The gate transistor 414 is connected to the output terminal pins 211 (terminal symbols A, B). Reference numeral 407 designates a resistor; 408, a diode; and 409, zener diodes.

Figure 17:
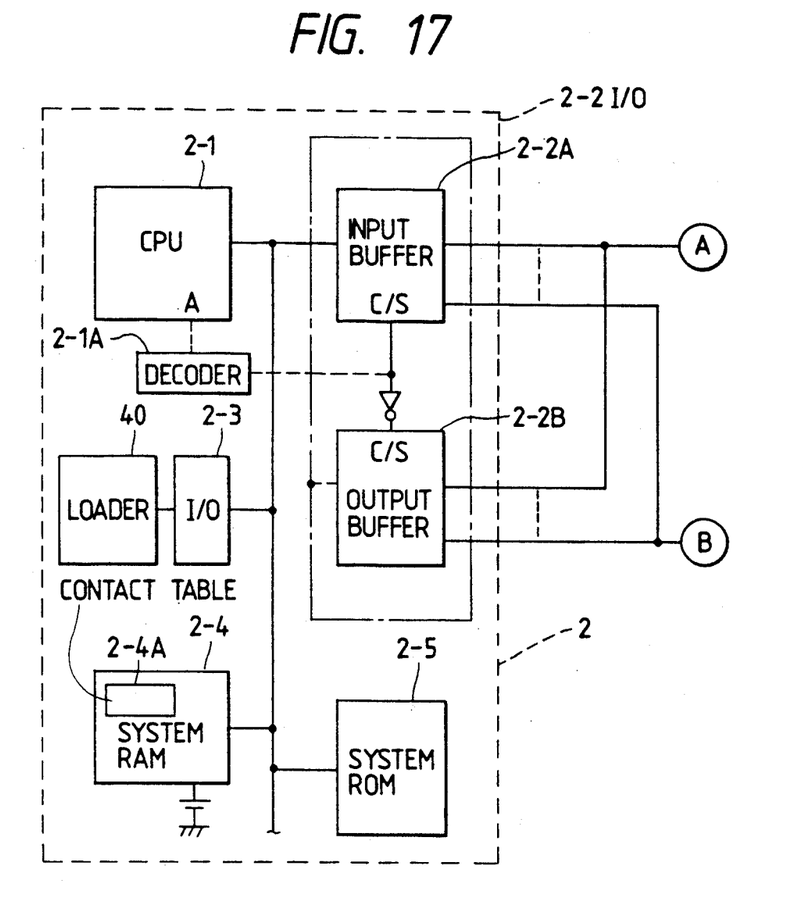
FIG. 17 is a block diagram showing a circuit configuration of another programmable controller according to the invention.
Figure 18:
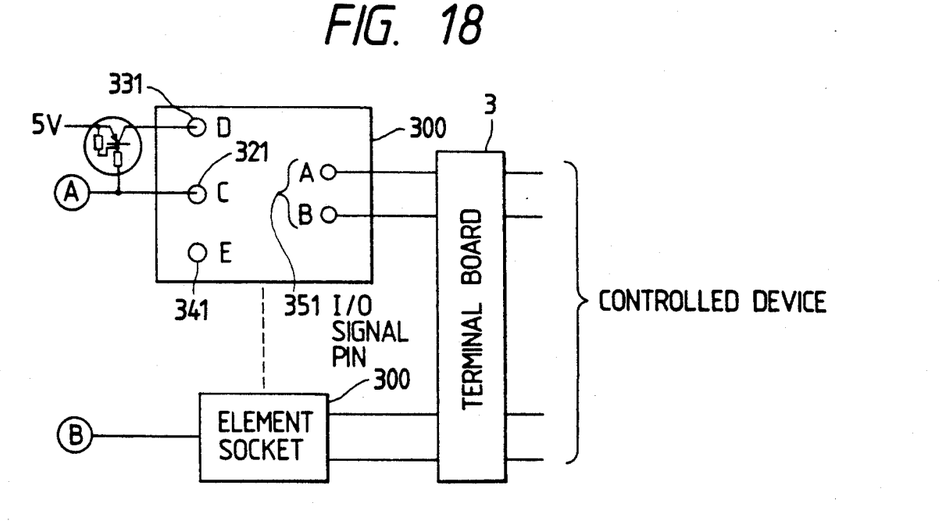
FIG. 18 is a block diagram showing a circuit configuration of the programmable controller shown in FIG. 17.

FIGS. 17 and 18 show exemplary circuit configurations of another programmable controller, which uses the I/O elements thus constructed. Like reference numerals in FIGS. 17 and 18 designate like parts and components in FIGS. 11 and 12.

The programmable controller shown in FIGS. 17 and 18 is distinguished from that shown in FIGS. 11 and 12 in that the respective element sockets 300 in the former have 5 pins: i.e., two I/O signal pins 351, a power pin 331, a control signal pin 321, and a reserved pin 341. The reserved pin 341 is not used when an input element is attached to the element socket 300 but is used as an output control signal pin when an output element is attached to the element socket 300.

As described above, these embodiments allow both the input element and the output element to be attached to an element socket, thereby eliminating the need for separately configuring the information input unit and the information output unit as is required in the conventional example. This reduces the space required for information signal I/O circuits as compared with the conventional example. The ratio of input elements and output elements assigned to the respective element sockets 30 can be arbitrarily defined by the user. This ability provides increased flexibility to the user in allowing such numbers of input and output elements as are required by a particular controlled device. These embodiments of the present invention allow the manufacturer of the programmable controller to be free of restrictions imposed by any one specification of I/O signals for a controlled device. A general-purpose programmable controller is thus provided.

The above embodiments may also be modified in the following manner. The previously described embodiments may have separate I/O registers connected to a single element socket. However, only one register may be used as long as such a register is usable both as the input and output register. In this case, an input instruction (temporary storage) and an output instruction (information signal buffering and outputting) is given to this double-purpose register by the CPU at a predetermined cycle. Furthermore, an element attached to an element socket is selected by the loader via the CPU in the above described embodiments. Such selection may, however, be made automatically in the following way. An electric switch is disposed on the input element and the output element so that a selection signal is provided for identifying the type of the attached element. The selection signal thus generated is identified by the CPU automatically.

As described in the foregoing, and according to the present invention, each element socket is shared by both the input and output elements. This allows the space for installing the I/O circuits to be reduced, thereby contributing to miniaturizing the programmable controller. In addition, the information signal can be received by or sent from an element in accordance with the type of the element attached to the element socket. This allows the socket connections to be permanently fixed, thereby eliminating the need for changing the socket connections every time the other type of element is connected.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An input/output unit for a programmable controller, the programmable controller having a central processing unit and controlling an external device, the input/output unit comprising:
    at least one input element for converting information signals received from the external device into input control signals compatible with the central processing unit;
    at least one output element for converting output control signals received from the central processing unit into information signals to be sent to the external device;
    wherein the at least one input element and the at least one output element have substantially similar external shapes and an identical connection pin layout; and,
    a plurality of element sockets, each one of the plurality of element sockets including means for replaceably attaching one of the at least one input element and the at least one output element.

2. An input/output unit, according to claim 1, wherein said at least one input element comprises a photocoupler for converting the information signals received from the external device into input control signals.

3. An input/output unit, according to claim 1, wherein said information signals received from the external device are AC signals, and the input element comprises a diode bridge rectifier for converting the information signals into input control signals.

4. An input/output unit, according to claim 1, wherein said at least one input element comprises a mechanical relay for converting the information signals received from the external device into input control signals.

5. An input/output unit, according to claim 1, wherein said at least one input element comprises a solid-state relay for converting the information signals received from the external device into input control signals.

6. An input/output unit, according to claim 1, wherein said at least one input element comprises a photovoltaic coupler for converting the information signals received from the external device into input control signals.

7. An input/output unit, according to claim 1, wherein said at least one output element comprises a photocoupler coupler for converting the output control signals received from the central processing unit into information signals.

8. An input/output unit, according to claim 1, wherein said at least one output element comprises a mechanical relay for converting the output control signals received from the central processing unit into information signals.

9. An input/output unit, according to claim 1, wherein said at least one output element comprises a solid-state relay for converting the output control signals received from the central processing unit into information signals.

10. An input/output unit, according to claim 1, wherein said at least one output element comprises a photovoltaic coupler for converting the output control signals received from the central processing unit into information signals.

11. A programmable controller having a central processing unit and controlling an external device comprising:
at least one input element for converting information signals received from the external device into input control signals compatible with the central processing unit;
at least one output element for converting output control signals received from the central processing unit into information signals to be sent to the external device;
wherein the at least one input element and the at least one output element have substantially similar external shapes and an identical connection pin layout; and,
signal input/output means having a plurality of element sockets, each one of the plurality of element sockets including means for replaceably attaching one of the at least one input element and the at least one output element;
means, responsive to the central processing unit, for selecting an element attached to each one of the plurality of element sockets;
signal storage means, responsive to the selecting means, for storing input and output control signals.

12. A programmable controller, according to claim 11, wherein said signal input/output means comprises an input buffer and an output buffer corresponding to each one of said plurality of element sockets; and
wherein said selecting means selects said input buffer when an input element is replaceably attached to a respective one of said plurality of element sockets, and selects said output buffer when an output element is replaceably attached to a respective one of said plurality of element sockets.

13. A programmable controller, according to claim 11, wherein said signal input/output means comprises a single register corresponding to each one of said plurality of element sockets, said single register responsive to said selecting means for receiving output control signals from the central processing unit when an output element is attached to a corresponding one of said plurality of element sockets and for receiving input control signals when an input element is attached to a corresponding one of said plurality of element sockets.

* * * * *